US010692984B2

(12) United States Patent
Chu (10) Patent No.: US 10,692,984 B2
(45) Date of Patent: Jun. 23, 2020

(54) III-NITRIDE FIELD-EFFECT TRANSISTOR WITH DUAL GATES

(71) Applicant: HRL Laboratories, LLC, Malibu, CA (US)

(72) Inventor: Rongming Chu, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/284,858

(22) Filed: Feb. 25, 2019

(65) Prior Publication Data

US 2019/0189762 A1 Jun. 20, 2019

Related U.S. Application Data

(62) Division of application No. 15/345,406, filed on Nov. 7, 2016, now Pat. No. 10,276,712.

(Continued)

(51) Int. Cl.
*H01L 31/0256* (2006.01)
*H01L 29/423* (2006.01)
(Continued)

(52) U.S. Cl.
CPC ...... *H01L 29/4236* (2013.01); *H01L 29/2003* (2013.01); *H01L 29/402* (2013.01);
(Continued)

(58) Field of Classification Search
CPC ............ H01L 29/2003; H01L 2924/00; H01L 29/7786; H01L 29/66462; H01L 29/4236;
(Continued)

(56) References Cited

U.S. PATENT DOCUMENTS 3,767,981 A 10/1973 Palata
5,661,318 A 8/1997 Nashimoto
(Continued)

FOREIGN PATENT DOCUMENTS

CN 101180420 5/2008
CN 102171830 8/2011
(Continued)

OTHER PUBLICATIONS

Ambacher, O. et al., "Two-Dimensional Electron Gases Induced by Spontaneous and Piezoelectric Polarization Charges in N- and Ga-face AlGaN/GaN Heterostructures," *Journal of Applied Physics*, vol. 85, No. 6, pp. 3222-3233, (Mar. 15, 1999).
(Continued)

*Primary Examiner* — Robert G Bachner
(74) *Attorney, Agent, or Firm* — Ladas & Parry (57) ABSTRACT

A field effect transistor (FET) includes a III-nitride channel layer, a III-nitride barrier layer on the channel layer, a first dielectric on the barrier layer, a first gate trench extending through the first dielectric, and partially or entirely through the barrier layer, a second dielectric on a bottom and walls of the first gate trench, a source electrode on a first side of the first gate trench, a drain electrode on a second side of the first gate trench opposite the first side, a first gate electrode on the second dielectric and filling the first gate trench, a third dielectric between the first gate trench and the drain electrode, a second gate trench extending through the third dielectric and laterally located between the first gate trench and the drain electrode, and a second gate electrode filling the second gate trench.

17 Claims, 9 Drawing Sheets

Related U.S. Application Data (60) Provisional application No. 62/257,328, filed on Nov. 19, 2015.

(51) Int. Cl.
*H01L 29/78* (2006.01)
*H01L 29/20* (2006.01)
*H01L 29/40* (2006.01)
*H01L 29/778* (2006.01)
H01L 29/51 (2006.01)

(52) U.S. Cl.
CPC ...... *H01L 29/7786* (2013.01); *H01L 29/7831* (2013.01); *H01L 29/518* (2013.01)

(58) Field of Classification Search
CPC . H01L 29/7787; H01L 29/205; H01L 29/872; H01L 29/402; H01L 29/66522; H01L 29/78; H01L 29/41766; H01L 29/778; H01L 29/66212; H01L 29/66666; H01L 29/407; H01L 29/42376; H01L 2224/94; H01L 2924/12032; H01L 2924/12042; H01L 2924/13062; H01L 21/28587; H01L 21/765; H01L 2224/49111; H01L 2924/00014; H01L 29/404; H01L 21/0217; H01L 21/02271; H01L 21/02274; H01L 21/0254; H01L 29/518; H01L 29/513; H01L 29/7781; H01L 21/283; H01L 21/30612; H01L 21/31105; H01L 2224/03; H01L 2224/48137
See application file for complete search history.

(56) References Cited

U.S. PATENT DOCUMENTS

| | | |
|---|---|---|
| 6,215,152 B1 | 4/2001 | Hebert |
| 6,423,645 B1 | 7/2002 | Wei et al. |
| 7,045,404 B2 | 5/2006 | Sheppard et al. |
| 7,304,331 B2 | 12/2007 | Saito et al. |
| 7,555,219 B2 | 6/2009 | Cox et al. |
| 7,573,078 B2 | 8/2009 | Wu et al. |
| 7,622,763 B2 | 11/2009 | Suda et al. |
| 7,671,383 B2 | 3/2010 | Hayashi et al. |
| 7,728,355 B2 | 6/2010 | Beach et al. |
| 7,800,132 B2 | 9/2010 | Smorchkova et al. |
| 8,124,505 B1 | 2/2012 | Burnham et al. |
| 8,169,005 B2 | 5/2012 | Wu et al. |
| 8,237,198 B2 | 8/2012 | Wu et al. |
| 8,530,978 B1 | 9/2013 | Chu et al. |
| 8,592,868 B2 | 11/2013 | Heikman et al. |
| 8,853,709 B2 | 10/2014 | Chu et al. |
| 8,872,233 B2 | 10/2014 | Lim et al. |
| 8,941,118 B1 | 1/2015 | Chu et al. |
| 9,024,357 B2 | 5/2015 | Valeria et al. |
| 9,059,200 B1 | 6/2015 | Chu et al. |
| 9,337,332 B2 | 5/2016 | Chu et al. |
| 9,508,843 B2 | 11/2016 | Lin |
| 9,812,532 B1 | 11/2017 | Chu et al. |
| 10,276,712 B2 | 4/2019 | Chu |
| 2001/0023964 A1 | 9/2001 | Wu et al. |
| 2003/0020092 A1 | 1/2003 | Parikh et al. |
| 2003/0151093 A1 | 8/2003 | Rumennik et al. |
| 2004/0061129 A1 | 4/2004 | Saxler et al. |
| 2005/0056893 A1 | 3/2005 | Hadizad |
| 2005/0098846 A1 | 5/2005 | Nagaoka |
| 2005/0285189 A1 | 12/2005 | Shibib et al. |
| 2006/0011915 A1 | 1/2006 | Saito et al. |
| 2006/0017064 A1 | 1/2006 | Saxler et al. |
| 2006/0060871 A1 | 3/2006 | Beach |
| 2006/0108606 A1 | 5/2006 | Saxler et al. |
| 2006/0194379 A1 | 8/2006 | Suda et al. |
| 2006/0249750 A1 | 11/2006 | Johnson et al. |
| 2007/0102727 A1* | 5/2007 | Twynam ............... H01L 29/402 257/194 |
| 2007/0138551 A1 | 6/2007 | Ko |
| 2007/0141823 A1 | 6/2007 | Preble et al. |
| 2007/0164322 A1 | 7/2007 | Smith et al. |
| 2007/0164326 A1 | 7/2007 | Okamoto et al. |
| 2007/0194354 A1 | 8/2007 | Wu et al. |
| 2007/0210332 A1 | 9/2007 | Ueno et al. |
| 2007/0235775 A1 | 10/2007 | Wu et al. |
| 2008/0121895 A1 | 5/2008 | Sheppard et al. |
| 2008/0157121 A1 | 7/2008 | Ohki |
| 2008/0237605 A1 | 10/2008 | Murata et al. |
| 2008/0258243 A1 | 10/2008 | Kuroda et al. |
| 2008/0261378 A1 | 10/2008 | Yao et al. |
| 2008/0290371 A1 | 11/2008 | Sheppard et al. |
| 2009/0008677 A1 | 1/2009 | Kikkawa |
| 2009/0042345 A1 | 2/2009 | Saxler et al. |
| 2009/0146186 A1 | 6/2009 | Kub et al. |
| 2009/0315078 A1 | 12/2009 | Parikh et al. |
| 2010/0025730 A1 | 2/2010 | Heikman et al. |
| 2010/0090251 A1 | 4/2010 | Lorenz et al. |
| 2010/0155780 A1 | 6/2010 | MacHida et al. |
| 2010/0210080 A1 | 8/2010 | Nomura et al. |
| 2011/0049526 A1 | 3/2011 | Chu et al. |
| 2011/0127604 A1 | 6/2011 | Sato |
| 2011/0133205 A1 | 6/2011 | Nagahisa et al. |
| 2011/0140172 A1 | 6/2011 | Chu et al. |
| 2011/0297958 A1 | 12/2011 | Kub et al. |
| 2012/0235160 A1 | 9/2012 | Heikman et al. |
| 2012/0261720 A1 | 10/2012 | Puglisi et al. |
| 2013/0001646 A1 | 1/2013 | Corrion et al. |
| 2013/0026495 A1 | 1/2013 | Chu et al. |
| 2013/0037868 A1 | 2/2013 | Okamoto et al. |
| 2013/0092947 A1 | 4/2013 | Green et al. |
| 2013/0105812 A1 | 5/2013 | Ishigaki et al. |
| 2013/0181224 A1 | 7/2013 | Lim et al. |
| 2013/0256699 A1 | 10/2013 | Vielemeyer et al. |
| 2013/0264578 A1 | 10/2013 | Mishra et al. |
| 2013/0306978 A1 | 11/2013 | Chen et al. |
| 2013/0313609 A1 | 11/2013 | Akutsu et al. |
| 2014/0092396 A1 | 4/2014 | Hopp |
| 2014/0097433 A1 | 4/2014 | Negoro et al. |
| 2014/0151747 A1 | 6/2014 | Jeon et al. |
| 2014/0159050 A1 | 6/2014 | Yoon et al. |
| 2014/0191288 A1 | 7/2014 | Kotani et al. |
| 2014/0264431 A1 | 9/2014 | Lal |
| 2015/0048419 A1 | 2/2015 | Okamoto et al. |
| 2015/0060946 A1 | 3/2015 | Makiyama |
| 2015/0179741 A1 | 6/2015 | Umeda et al. |

FOREIGN PATENT DOCUMENTS

| | | |
|---|---|---|
| CN | 102184947 | 9/2011 |
| CN | 102881716 | 1/2013 |
| CN | 101752430 | 6/2016 |
| JP | 2008/227501 | 9/2008 |
| JP | 2009/099678 | 5/2009 |
| JP | 2012/156164 | 8/2012 |
| JP | 2013/140835 | 7/2013 |
| WO | 2007/062589 | 6/2007 |
| WO | 2012/172753 | 12/2012 |

OTHER PUBLICATIONS

Burnham, Shawn D. et al., "Gate-Recessed Normally-Off GaN-on-Si HEMT Using a New O2—BCl3 Digital Etching Technique," *Physica Status Solidi C7*, *(ICNS-8)*, vol. 7, No. 7-8, pp. 2010-2012, (2010).

Buttari D. et al., "Digital Etching for Highly Reproducible Low Damage Gate Recessing on AlGaN/GaN HEMTs," *Proceedings, IEEE Lester Eastman Conference, High Performance Devices*, pp. 461-469, (Aug. 6-8, 2002).

Buttari D. et al., "Origin of Etch Delay Time in C12 Dry Etching of AlGaN/GaN Structures," *Applied Physics Letters*, vol. 83, No. 23, pp. 4779-4781, (Dec. 8, 2003).

(56) References Cited

OTHER PUBLICATIONS

Buttari D. et al., "Selective Dry Etching of GaN Over AlGaN in BCL3/SF6 Mixtures," *Proceedings, IEEE Lester Eastman Conference, High Performance Devices*, vol. 14, No. 3, pp. 132-137, (Aug. 2004).
Cai, Yong et al., "High-Performance Enhancement-Mode AlGaN/GaN HEMTs Using Fluoride-Based Plasma Treatment," *IEEE Electron Device Letters*, vol. 26, No. 7, pp. 435-437, (Jul. 2005).
Chen, T. et al., "AlGaN/GaN MIS HEMT with ALD Dielectric," *Digest of CS Mantech Conference*, pp. 227-230, (Apr. 24-27, 2006).
DeSalvo, Gregory C. et al., "Wet Chemical Digital Etching of GaAs at Room Temperature," *Journal of the Electrochemical Society*, vol. 143, No. 11, pp. 3652-3656, (Nov. 1996).
Dora, A. Chakraborty, L. McCarthy, S. Keller, S. P. Denbaars, and U.K. Mishra,"High Breakdown Voltage Achieved on AlGaN/GaN HEMTs with Integrated SlantField Plates", IEEE Electron Dev. Lett., vol. 27, No. 9, Sep. 2006.
Hahn et al., "p-Channel Enhancement and Depletion Mode GaN-Based HFETs with Quaternary Backbarriers," *IEEE Transaction on Electron Devices*, vol. 60, No. 10, pp. 3005-3011, (Oct. 2013).
Harris H. et al., "Plasma Enhanced Metalorganic Chemical Vapor Deposition of Amorphous Aluminum Nitrade," *Journal of Applied Physics*, American Institute of Physics, vol. 90, No. 11, pp. 5825-5831, (Dec. 1, 2011).
Hashizume, T. et al., "Capacitance-Voltage Characterization of AlN/GaN Metal-Insulator-Semiconductor Structures Grown on Sapphire Substrate by Metalorganic Chemical Vapor Deposition," *Journal of Applied Physics*, vol. 88, No. 4, pp. 1983-1986, (Aug. 15, 2000).
Keogh, David et al., "Digital Etching of III-N Materials Using a Two-Step Ar/KOH Technique," *Journal of Electronic Materials*, vol. 35, No. 4, pp. 771-776, (2006).
Khan, M. Asif et al., "Enhancement and Depletion Mode GaN/AlGaN Heterostructure Field Effect Transistors," *Applied Physics Letters*, vol. 68, No. 4, pp. 514-516, (Jan. 22, 1996).
Lanford, W. B. et al., "Recessed-gate enhancement-mode GaN HEMT with high threshold voltage," *Electronics Letters*, vol. 41, No. 7, pp. 449-450, (Mar. 31, 2005).
Li, G. et al., "Polarization-Induced GaN-on-Insulator E/D Mode p-Channel Heterostructure FETs," *IEEE Electron Device Letters*, vol. 34, No. 7, pp. 852-854, (Jul. 2013).
Ludviksson, Audunn et al., "Atomic Layer Etching Chemistry of Cl2 on GaAs(100)," *Surface Science*, vol. 277, pp. 282-300, (1992).
Maher, H. et al., "Smooth Wet Etching by Ultraviolet-Assisted Photoetching and Its Application to the Fabrication of AlGaN/GaN Heterostructure Field-Effect Transistors," *Applied Physics Letters*, vol. 77, No. 23, pp. 3833-3835, (Dec. 4, 2000).
Moon, Jeong S. et al., "Submicron Enhancement-mode AlGaN/GaN HEMTs," *Device Research Conference, 60$^{th}$ DRC. Conference Digest*, pp. 23-24, (2002).
Okamoto Y. et al., "179 W Recessed-Gate AlGaN/GaN Heterojunction FET with Field-Modulating Plate," *Electronics Letters*, vol. 40, No. 10, (May 13, 2004).
Parish, G. et al., "Simple Wet Etching of GaN," *Proceedings of SPIE, Device and Process Technologies for MEMS and Microelectronics II*, vol. 4592, pp. 104-110, (2001).
Pei, Z. Chen, D. Brown, S. Keller, S. P. Denbaars, and U.K. Mishra, "Deep-Submicrometer AlGaN/GaN HEMTs With Slant Field Plates", *IEEE Electron Dev. Lett.*, vol. 30, No. 4, Apr. 2009.
Shatalov, M. et al., "GaN/AlGaN p-Channel Inverted Heterostructure JFET," *IEEE Electron Device Letters*, vol. 23, No. 8, pp. 452-454, (Aug. 2002).
Srivastava et al: "Silicon Substrate Engineered High-Voltage High-Temperature GaN-DHFETs". IEEE Transactions on Electron Devices, vol, 60, No. 7, Jul. 2013, pp. 2217-2223.
Xing, Y. Dora, A. Chini, S. Heikman, S. Keller, and U.k. Mishra, "High breakdown voltage AlGaN—GaN HEMTs Achieved by Multiple Field Plates," *IEEE Electron Dev. Lett.*, vol. 25, No. 4, Apr. 2004.

Zimmermann, T. et al., "P-Channel InGaN HFET Structure Based on Polarization Doping," *IEEE Electron Device Letters*, vol. 25, No. 7, pp. 450-452, (Jul. 2004).
From Chinese Application No. 2012800379093, Office Action dated Feb. 2, 2016 and its English translation provided by Chinese associate.
From Chinese Application No. 201280059254, Office Action dated Apr. 29, 2016 and its English translation provided by Chinese associate.
From Chinese Application No. 201380079683.8, Office Action dated Jul. 26, 2017 with English translation provided by Chinese associate.
From Chinese Application No. 201380079683.8, Office Action dated Nov. 30, 2016 with English translation provided by Chinese associate.
From Chinese Application No. 201480052849.1, Office Action dated Dec. 28, 2017 with machine English translation from Global Dossier.
From European Patent Application No. 12819630.0, Extended Search Report with Search Opinion dated Mar. 6, 2015.
From European Patent Application No. 12819630.0, Office Action dated Mar. 13, 2019.
From European Patent Application No. 12819630.0, Office Action dated Oct. 31, 2017.
From European Patent Application No. 12819630.0, Summons on Oral Proceedings dated Oct. 24, 2018.
From European Patent Application No. 13894581.1, Extended Search Report with Search Opinion dated Apr. 24, 2017.
From European Patent Application No. 13894581.1, Office Action dated Oct. 26, 2018.
From European Patent Application No. 14847483.6, Extended Search Report with Search Opinion dated Apr. 28, 2017.
From European Patent Application No. 14847483.6, Office Action dated Oct. 30, 2018.
From European Patent Application No. 16866855.6, Extended Search Report with Search Opinion dated Aug. 9, 2019.
From PCT/US2012/038013, Chapter I, International Preliminary Report on Patentability (IPRP) dated Jun. 10, 2014.
From PCT/US2012/038013, PCT International Search Report and Written Opinion dated Feb. 21, 2013.
From PCT/US2012/043114, Chapter II International Preliminary Report on Patentability (IPRP) dated Jul. 3, 2013.
From PCT/US2012/043114, International Search Report and Written Opinion dated Dec. 26, 2012.
From PCT/US2013/062750, Chapter II International Preliminary Report on Patentability (IPRP) dated Aug. 25, 2015.
From PCT/US2013/062750, International Search Report and Written Opinion dated Jun. 26, 2014.
From PCT/US2014/055881, Chapter I, International Preliminary Report on Patentability (IPRP) dated Apr. 14, 2016.
From PCT/US2014/055881, International Search Report and Written Opinion dated Dec. 22, 2014.
From PCT/US2016/060863, International Preliminary Report on Patentability (IPRP); CH 2) dated Jan. 16, 2018.
From PCT/US2016/060863, International Search Report and Written Opinion dated Mar. 20, 2017.
From U.S. Appl. No. 12/909,497 (Now U.S. Pat. No. 8,124,505), Non-Final Rejection dated May 31, 2011.
From U.S. Appl. No. 12/909,497 (Now U.S. Pat. No. 8,124,505), Notice of Allowance dated Nov. 10, 2011.
From U.S. Appl. No. 12/909,497 (Now U.S. Pat. No. 8,124,505), Notice of Allowance dated Oct. 24, 2011.
From U.S. Appl. No. 13/312,406 (Now U.S. Pat. No. 8,530,978), Notice of Allowance dated Dec. 27, 2012.
From U.S. Appl. No. 13/312,406 (Now U.S. Pat. No. 8,530,978), Notice of Allowance dated May 23, 2013.
From U.S. Appl. No. 13/456,039 (Now U.S. Pat. No. 8,853,709), Advisory Action dated Sep. 6, 2013.
From U.S. Appl. No. 13/456,039 (Now U.S. Pat. No. 8,853,709), Final Rejection dated Jul. 12, 2013.
From U.S. Appl. No. 13/456,039 (Now U.S. Pat. No. 8,853,709), Non-Final Rejection dated Apr. 3, 2013.

(56) References Cited

OTHER PUBLICATIONS

From U.S. Appl. No. 13/456,039 (Now U.S. Pat. No. 8,853,709), Non-Final Rejection dated Apr. 14, 2014.
From U.S. Appl. No. 13/456,039 (Now U.S. Pat. No. 8,853,709), Notice of Allowance dated Aug. 12, 2014.
From U.S. Appl. No. 13/456,039 (Now U.S. Pat. No. 8,853,709), Notice of Allowance dated Jun. 6, 2014.
From U.S. Appl. No. 13/456,039 (Now U.S. Pat. No. 8,853,709), Rejection/Election dated Mar. 22, 2013.
From U.S. Appl. No. 14/041,667 (Now U.S. Pat. No. 8,941,118), Notice of Allowance dated Sep. 19, 2014.
From U.S. Appl. No. 14/290,029 (Now U.S. Pat. No. 9,337,332), Final Rejection dated Oct. 22, 2015.
From U.S. Appl. No. 14/290,029 (Now U.S. Pat. No. 9,337,332), Non-Final Rejection dated Apr. 24, 2015.
From U.S. Appl. No. 14/290,029 (Now U.S. Pat. No. 9,337,332), Notice of Allowance dated Jan. 14, 2016.
From U.S. Appl. No. 14/469,187 (Now U.S. Pat. No. 9,059,200), Non-Final Rejection dated Nov. 25, 2014.
From U.S. Appl. No. 14/469,187 (Now U.S. Pat. No. 9,059,200), Notice of Allowance dated Feb. 13, 2015.
From U.S. Appl. No. 14/469,187 (Now U.S. Pat. No. 9,059,200), Notice of Allowance dated May 11, 2015.
From U.S. Appl. No. 14/838,958 (Now U.S. Pat. No. 9,812,532,) Notice of Allowance dated Jul. 17, 2017.
From U.S. Appl. No. 14/838,958 (Now U.S. Pat. No. 9,812,532), Final Rejection dated Dec. 1, 2016.
From U.S. Appl. No. 14/838,958 (Now U.S. Pat. No. 9,812,532), Notice of Allowance dated Feb. 27, 2017.
From U.S. Appl. No. 14/838,958 (Now U.S. Pat. No. 9,812,532), Non-Final Rejection dated May 19, 2016.
From U.S. Appl. No. 15/345,406 (Now U.S. Pat. No. 10,276,712), Ex Parte Quayle Action mailed on Nov. 16, 2018.
From U.S. Appl. No. 15/345,406 (Now U.S. Pat. No. 10,276,712), Non-Final Rejection dated Aug. 29, 2018.
From U.S. Appl. No. 15/345,406 (Now U.S. Pat. No. 10,276,712), Notice of Allowance dated Dec. 17, 2018.
From U.S. Appl. No. 15/345,406 (Now U.S. Pat. No. 10,276,712), Restriction/Election dated May 7, 2018.

* cited by examiner

III-NITRIDE FIELD-EFFECT TRANSISTOR WITH DUAL GATES

CROSS REFERENCE TO RELATED APPLICATIONS

This application is a divisional application of U.S. patent application Ser. No. 15/345,406, filed on Nov. 7, 2016, which is incorporated herein by reference as though set forth in full. This application relates to U.S. Pat. No. 8,530,978, issued Sep. 10, 2013, U.S. Pat. No. 8,853,709, issued Oct. 7, 2014, U.S. Pat. No. 8,941,118, issued Jan. 27, 2015, and U.S. patent application Ser. No. 14/290,029, filed May 29, 2014, and relates to and claims the benefit of priority from U.S. Provisional Patent Application 62/257,328, filed Nov. 19, 2015, which are incorporated herein by reference as though set forth in full.

STATEMENT REGARDING FEDERAL FUNDING

None.

TECHNICAL FIELD

This disclosure relates to field effect transistors (FETs).

BACKGROUND

Field effect transistors generally have a source electrode, a drain electrode and a gate electrode, which controls the current between the source electrode and the drain electrode. A reduced electric field on the current controlling gate electrode is desirable to make the threshold voltage more stable and to improve the reliability of the gate structure. In the prior art, field-plates have been used for this purpose.

U.S. Pat. No. 8,530,978, issued Sep. 10, 2013, U.S. Pat. No. 8,853,709, issued Oct. 7, 2014, U.S. Pat. No. 8,941,118, issued Jan. 27, 2015, and U.S. patent application Ser. No. 14/290,029, filed May 29, 2014, which are incorporated herein by reference, describe field effect transistors, which are GaN FETs that have normally-off operation, high voltage operation, low on-resistance, and desirable dynamic characteristics. However, the prior art normally-off GaN transistor gate structures often experience a drift of threshold voltage under large drain bias.

Figure 1A:
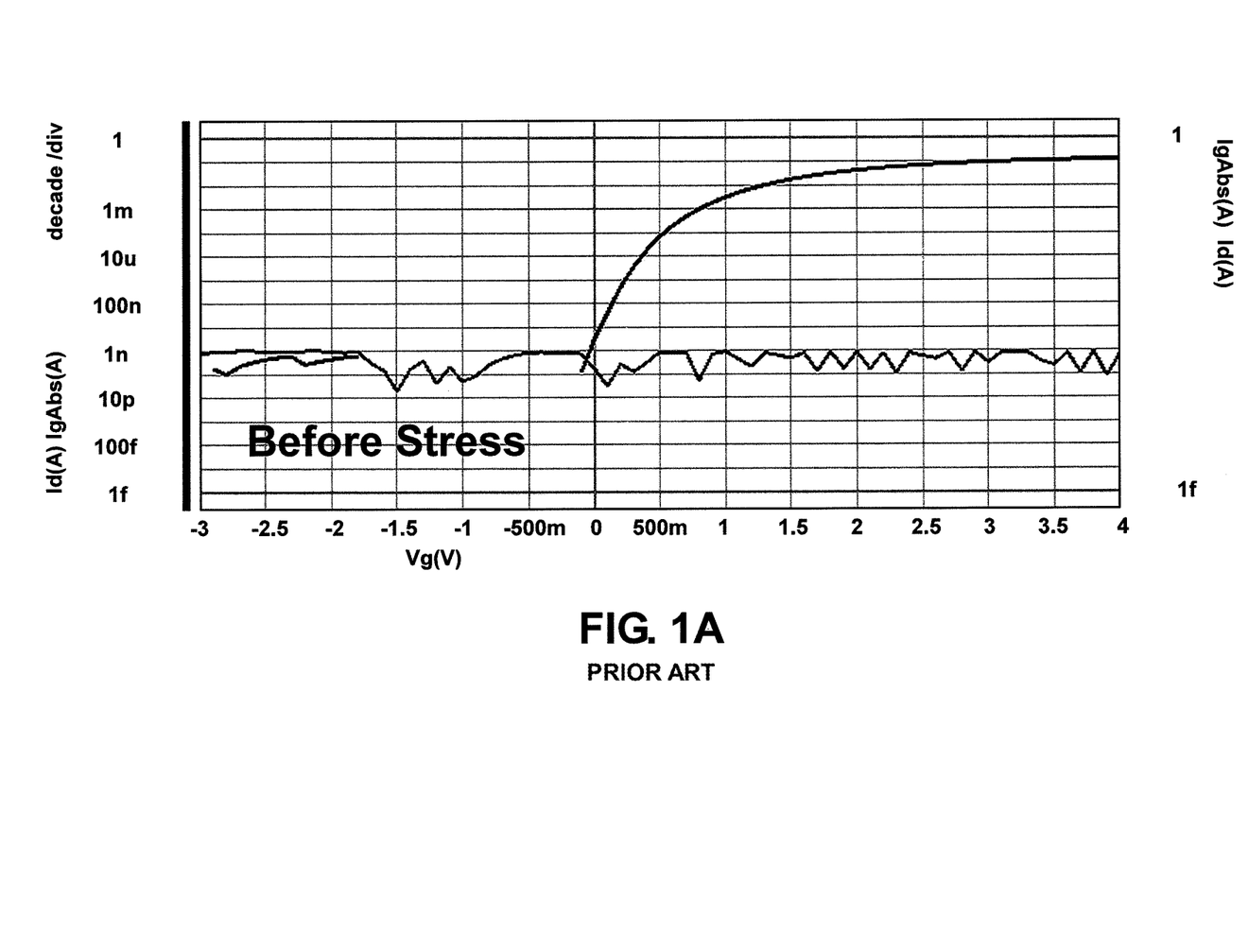
FIG. 1A shows an example prior art FET threshold voltage before stress.
Figure 1B:
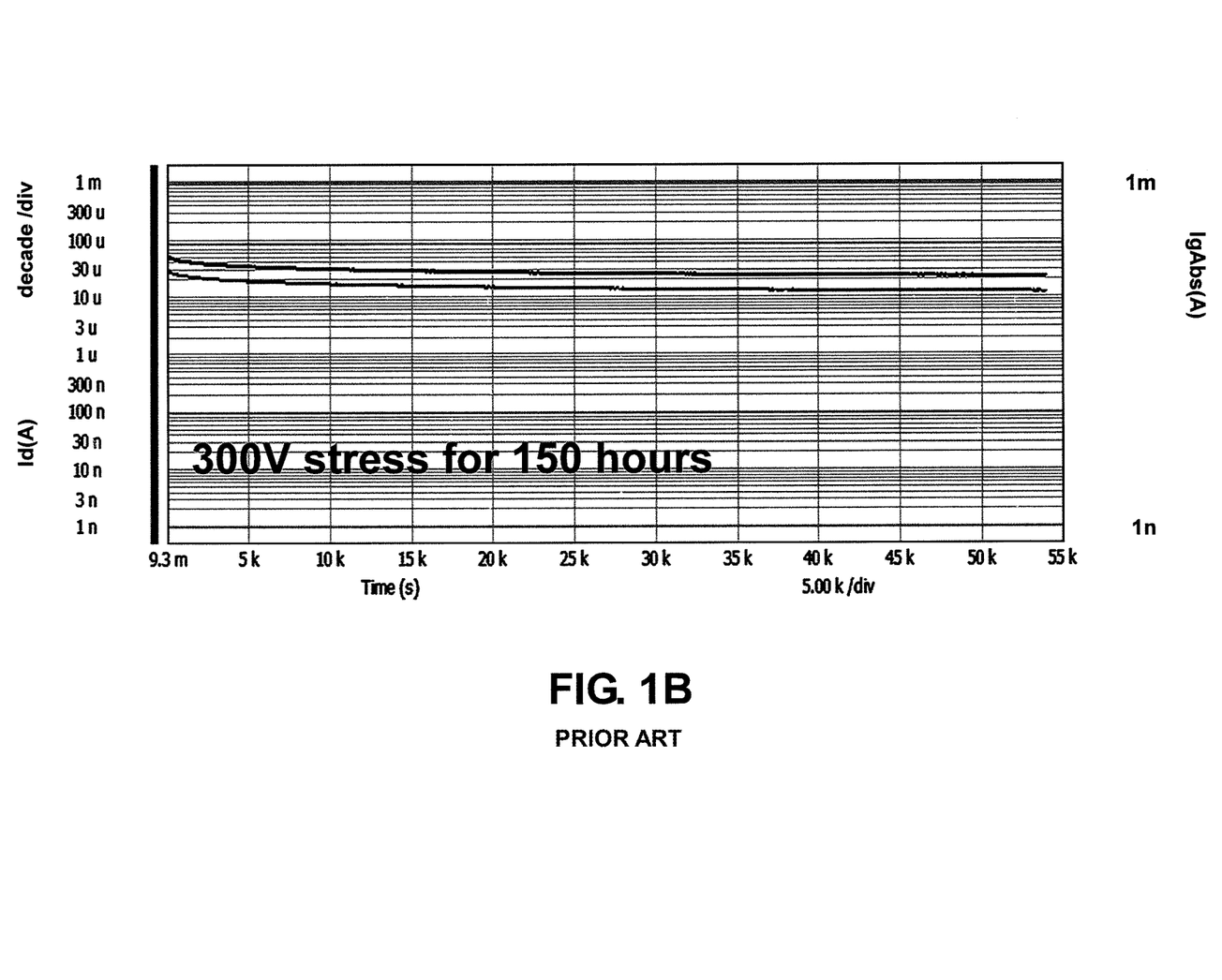
FIG. 1B shows a high 300 volt stress applied to the drain for 150 hours.
Figure 1C:
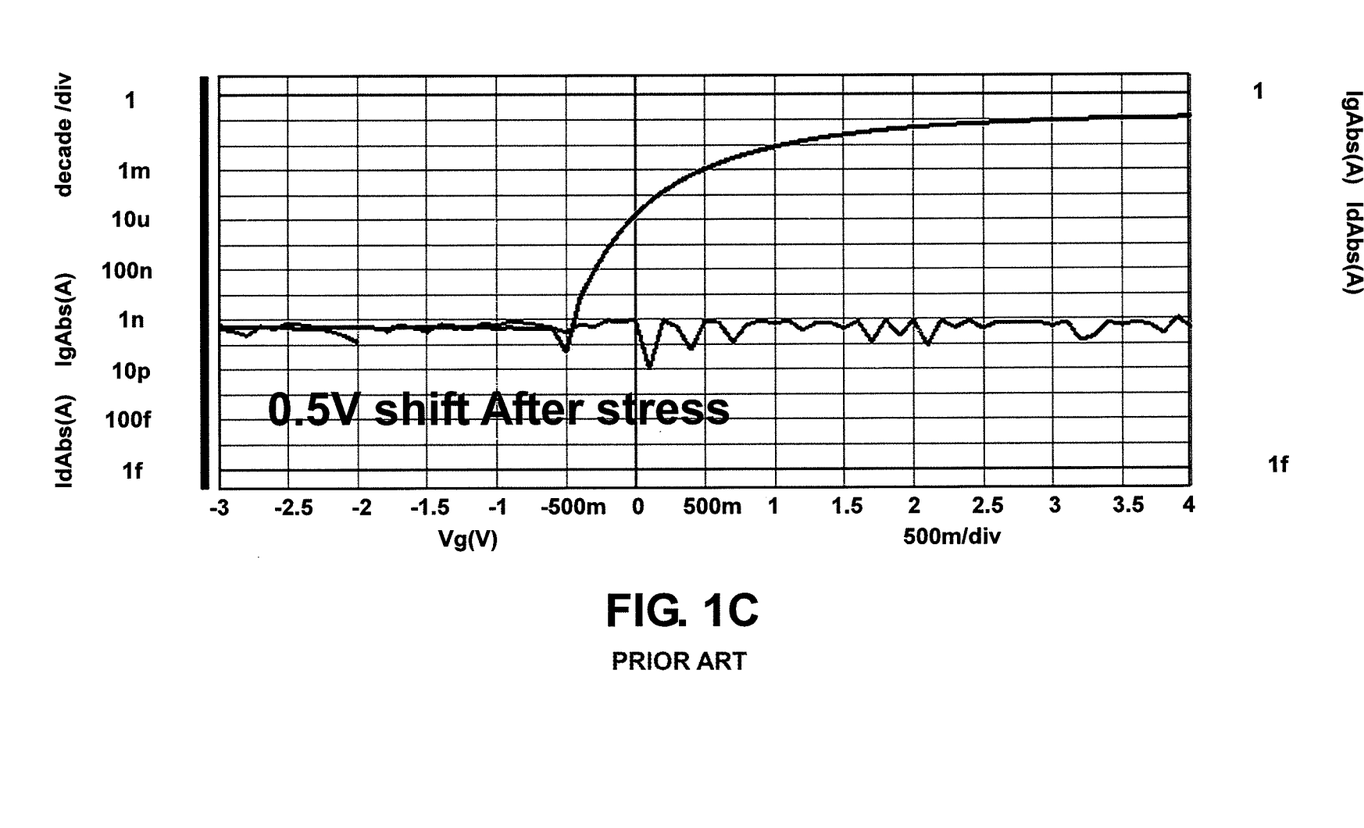
FIG. 1C shows the prior art FET threshold voltage after the high voltage stress which shows a 0.5 volt drift in the threshold voltage caused by the high voltage stress for a prior art FET with field plates.

FIGS. 1A, 1B and 1C show an example of threshold voltage drift for a prior art FET with field plates. FIG. 1A shows the FET threshold voltage before stress, which shows the threshold voltage to be approximately Vg=0 volts. FIG. 1B shows a high 300 volt stress applied to the drain for 150 hours. FIG. 1C shows that after the high voltage stress, the threshold voltage shifted by 0.5 volts to approximately Vg=-0.5 volts. The threshold voltage shift is undesirable.

What is needed are more reliable normally-off high-voltage III-Nitride power transistors, which have reduced or no threshold voltage drift under a large drain bias. The embodiments of the present disclosure answer these and other needs.

SUMMARY

In a first embodiment disclosed herein, a field effect transistor (FET) comprises a III-nitride channel layer, a III-nitride barrier layer on the channel layer, a first dielectric on the barrier layer, a first gate trench extending through the first dielectric, and partially or entirely through the barrier layer, a second dielectric on a bottom and walls of the first gate trench, a source electrode having electrical contact to the channel layer on a first side of the first gate trench, a drain electrode having electrical contact to the channel layer on a second side of the first gate trench opposite the first side, a first gate electrode on the second dielectric and filling the first gate trench, a third dielectric between the first gate trench and the drain electrode, a second gate trench extending through the third dielectric and laterally located between the first gate trench and the drain electrode, and a second gate electrode filling the second gate trench.

In another embodiment disclosed herein, a method of fabricating a field effect transistor comprises forming a III-nitride channel layer, forming a III-nitride barrier layer on top of the channel layer, forming a first dielectric on top of the barrier layer, forming a first gate trench through the first dielectric and partially or entirely through the barrier layer, forming a second dielectric on a bottom and walls of the first gate trench, forming a source electrode having electrical contact to the channel layer on a first side of the first gate trench, forming a drain electrode having electrical contact to the channel layer on a second side of the first gate trench opposite the first side, forming a first gate electrode on the second dielectric and filling the first gate trench, forming a third dielectric between the first gate trench and the drain electrode, forming a second gate trench extending through the third dielectric and laterally located between the first gate trench and the drain electrode, and forming a second gate electrode filling the second gate trench.

In yet another embodiment disclosed herein, a field-effect transistor comprises a III-nitride channel layer, a III-nitride barrier layer on the channel layer, a first dielectric on the barrier layer, a source electrode disposed on a first end of the field effect transistor, a drain electrode disposed on a second end of the field effect transistor opposite the first end, a first gate structure disposed between the source electrode and the drain electrode, and a second gate structure disposed between the first gate structure and the drain electrode.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 2:
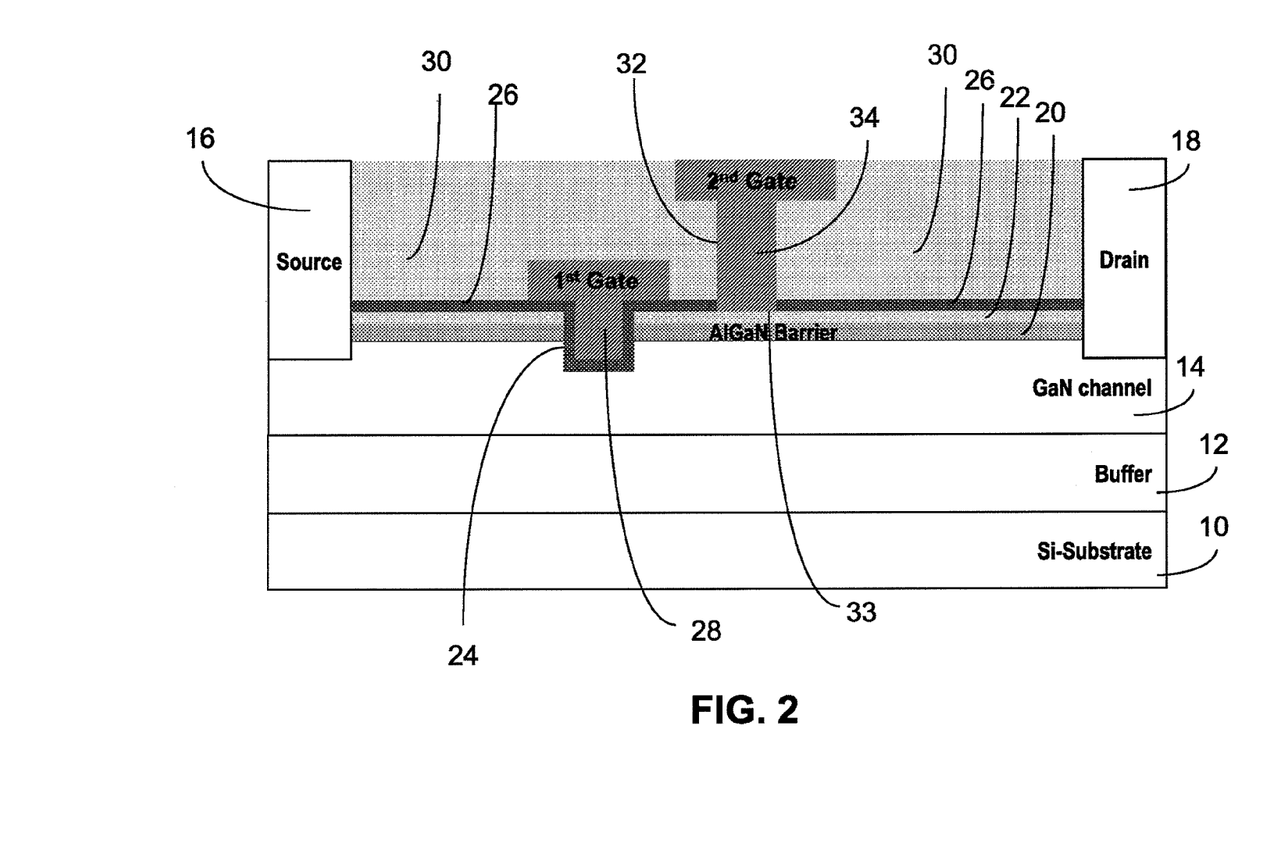
FIG. 2 shows an elevation sectional view of a dual gate III-nitride field effect transistor in accordance with the present disclosure.

FIG. 2 shows an elevation sectional view of a dual gate III-nitride field effect transistor in accordance with the present disclosure.

The substrate 10 may be Si, Sapphire, SiC, GaN or AlN. A III-nitride buffer layer 12 is on the substrate 10. A III-nitride channel layer 14, which may be any III-nitride and preferably GaN, is on top of the buffer layer 12. A source electrode 16 is in electrical contact with the channel layer 14 on one side of the channel layer 14, and a drain electrode 18 is in electrical contact with the channel layer 14 on another side of the channel layer 14. A III-nitride barrier layer 20 with a bandgap greater than the channel layer 14, is on top of the channel layer 14. The III-nitride barrier layer may preferably be 1 nanometer (nm) to 20 nm thick AlGaN. A first dielectric 22, which may typically be 1 nm to 100 nm thick SiN, is on top of the barrier layer 20.

A first gate trench 24 extends through the first dielectric 22 and partially through the barrier layer 24, or extends through the first dielectric 22 and entirely through the barrier layer 24 to the channel layer 14. A second dielectric 26, which may typically be AlN-based, is on the walls and the bottom of the first gate trench 24. The second dielectric may also be over the first dielectric 22.

A metallic first gate electrode 28 is on the second dielectric 26 and fills the first gate trench 24 and may extend partially over the second dielectric 26 on either side of the first gate trench 24. A third dielectric 30, which may typically be SiN having a thickness ranging from 0.1 nm to 10 µm, may cover the first gate electrode 28 and extend between the source electrode 16 and the drain electrode 18, or at least cover the first gate electrode 28 and extend between the first gate electrode 28 and the drain electrode 18. The third dielectric 30 may be on the second dielectric 26.

The first gate trench 24, the second dielectric 26, and the metallic first gate electrode 28 collectively form a first gate structure.

A second gate trench 32 is located between the first gate electrode 28 and the drain electrode 18. The second gate trench 32 extends through the third dielectric 30 and the bottom 33 of the second gate trench 32 may be located between the top surface of the barrier layer 20 and a top surface of the second dielectric 26. In one embodiment, shown in FIG. 2, the bottom 33 of the second gate trench 32 is on the top surface of the first dielectric 22. A metallic second gate electrode 34 fills the second gate trench 32. In the embodiment, shown in FIG. 2, because the first dielectric 22 is 1 nm to 100 nm thick, the distance between the bottom 33 of the second gate electrode 34 and a top surface of the barrier layer 20 is 1 nm to 100 nm.

The second gate trench 32 and the metallic first gate electrode 34 collectively form a second gate structure.

In the embodiment shown in FIG. 2 the second gate electrode 34 is not electrically connected to the source electrode 16.

Figure 3:
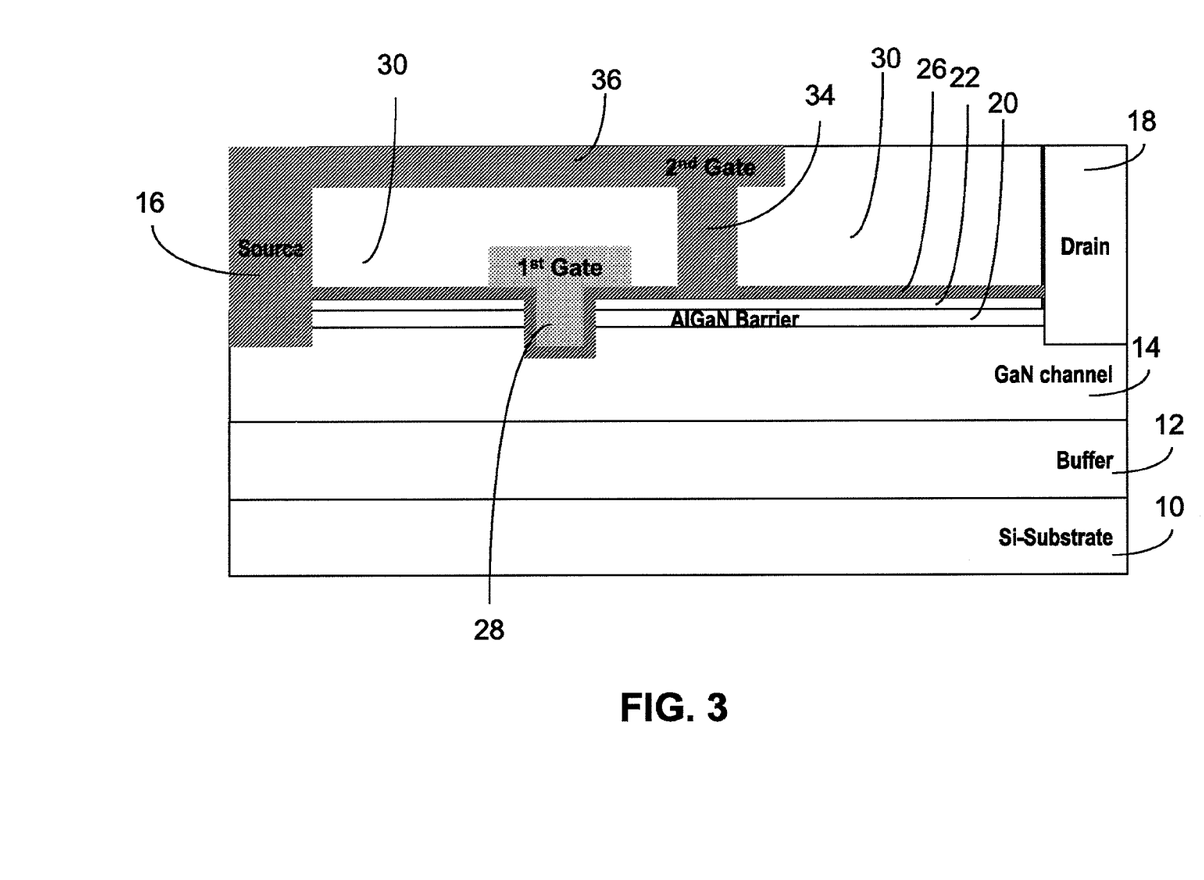
FIG. 3 shows an elevation sectional view of another dual gate III-nitride field effect transistor in accordance with the present disclosure.

FIG. 3 shows an elevation sectional view of another dual gate III-nitride field effect transistor in accordance with the present disclosure. In this embodiment the second gate electrode 34 is electrically connected to the source electrode 16 by metal 36. The metal 36 is insulated from the first gate electrode 28 by third dielectric 30, which is between the metal 36 and the first gate electrode 28.

Figure 4:
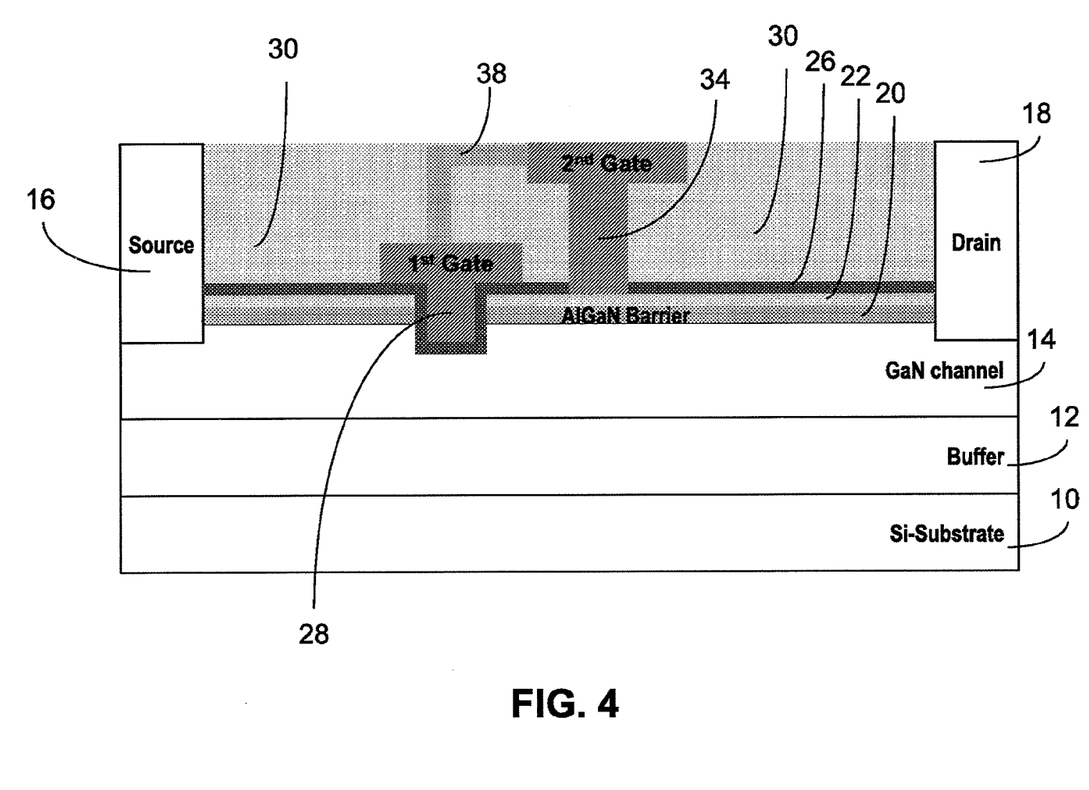
FIG. 4 shows an elevation sectional view of yet another dual gate III-nitride field effect transistor in accordance with the present disclosure.

FIG. 4 shows an elevation sectional view of yet another dual gate III-nitride field effect transistor in accordance with the present disclosure. In this embodiment the second gate electrode 34 is electrically connected to the first gate electrode 28 by metal 38. FIG. 4 shows one embodiment of the metal 38. A person skilled in the art would understand that the metal 38 between the second gate electrode 34 and the first gate electrode 28 may have various geometries.

In the embodiment shown in FIG. 2, the second gate electrode 34 may be biased independently of the first gate electrode 28.

The first gate electrode 28 is a normally-off gate while the second gate electrode 34 is a normally-on gate. Therefore, without external biases applied to the either the first gate electrode 28 or the second gate electrode 34, there are no mobile electrons under the first gate electrode 28, however, there are mobile electrons under the second gate electrode 34.

The threshold voltage of the second gate electrode 34 may range from 0 Volts (V) to −50V. The threshold voltage is determined by the electron density in the channel, the vertical distance between the channel and the bottom of the gate electrode, as well as the dielectric constant of the layers between the channel and the bottom of the gate electrode. One can easily adjust the threshold voltage of the second electrode, for example, by varying the thickness of the 1st dielectric, or by varying the etch depth of the 2nd gate trench.

The first gate electrode 28 is a normally-off gate controlling the current through the channel 14. The second gate electrode 34 is a normally-on gate shielding the first gate electrode 28 from being affected by large drain voltage biases. As described above, the second gate electrode 34 may be independently biased, electrically connected to the source electrode 16, or connected to the first gate electrode 28. A preferred embodiment is to connect the second gate electrode 34 to the source electrode 16, acting as a source-connected field-plate, as shown in FIG. 3.

Without the second gate electrode 34, there is a large voltage drop between the first gate electrode 28 and the drain electrode 18 when the transistor is at off-state blocking high voltages. The large voltage drop results in high electric-field across the first gate electrode 28. The high electric-field accelerates the change of charge states of the traps under the first gate electrode 28, leading to shift of threshold voltage. Threshold voltage shift negatively affects device stability.

For a FET in accordance with the present disclosure, the second gate electrode 34 electrically shields the first gate electrode 28 from drain electrode 18 biases as soon as the channel electrons under the second gate electrode 34 are depleted. The maximum voltage drop applied to the first gate electrode 28 will be no more than the threshold voltage of the second gate electrode 34. Therefore, we can design the second gate electrode 34 to make sure voltage drop across the first gate electrode 28 is small enough for stable operation.

Although the second gate electrode 34 is now exposed to large voltage drop induced by drain bias, a moderate shift of the threshold voltage of the second gate electrode 34 is less critical to device operation, because the first gate electrode 28, which is closer to the source, controls the channel current.

The following describes the fabrication process for making a FET according to the present disclosure.

The III-nitride buffer layer 12 is grown on top of the substrate 10, which may be Si, Sapphire, SiC, GaN or AlN. Then the III-nitride channel layer 14, which may be any II=nitride and preferably GaN, is grown on top of the buffer layer 12. Next, the III-nitride barrier layer 20 with a bandgap greater than the channel layer 14 is grown on top of the channel layer 14. The III-nitride barrier layer 20 may preferably be 1 nanometer (nm) to 20 nm thick AlGaN. Then, the first dielectric 22, which may typically be 1 nm to 100 nm thick SiN, is deposited on top of the barrier layer 20.

The first gate trench 24 is then formed through the first dielectric 22 and partially or entirely through the barrier layer 20 to remove channel electrons under the first gate electrode 28 induced by the barrier layer 20. Next, the second dielectric 26, which may typically be AlN-based is deposited to line the first gate trench 24. The second dielectric may also extend between the first gate trench 24 and the source dielectric 16 and between the first gate trench 24 and the drain dielectric 18

The source electrode 16 and the drain electrode 18 are then formed on the two opposite sides of the first gate trench 24. The source electrode 16 and the drain electrode 18 are in electrical contact with the channel 14.

The first gate electrode 28 of metal is then formed on the second dielectric 26, filling the first gate trench 24. Next, the third dielectric 30, which may be typically 0.1 nm to 10 µm thick SiN is deposited covering at least the portion between the first gate electrode 28 and the drain electrode 18, and in some embodiments, such as FIG. 3, covering also between the first gate electrode 28 and the source electrode 16.

Then, the second gate trench 32 is formed through the third dielectric 30 and located between the first gate electrode 28 and the drain electrode 18. Next, the second gate electrode 34 of metal formed in the second gate trench 32. The second gate trench 32 extends through the third dielectric 30 and the bottom 33 of the second gate trench 32 may be located between the top surface of the barrier layer 20 and a top surface of the second dielectric 26. In one embodiment, shown in FIG. 2, the bottom 33 of the second gate trench 32 is on the top surface of the first dielectric 22. The metallic second gate electrode 34 fills the second gate trench 32. In the embodiment, shown in FIG. 2, because the first dielectric 22 is 1 nm to 100 nm thick, the distance between the bottom 33 of the second gate electrode 34 and a top surface of the barrier layer 20 may range from 1 nm to 100 nm.

For the embodiment of FIG. 3, the metal 36 is then deposited on the third dielectric 30 to electrically connect the second gate electrode 34 to the source electrode 16. For this embodiment the third dielectric 30 insulates the first gate electrode 28 from the second gate electrode 34.

For the embodiment of FIG. 4, the metal 38 is then deposited to electrically connect the second gate electrode 34 to the first gate electrode 28. This may include patterning and depositing steps well known in the art.

Figure 5A:
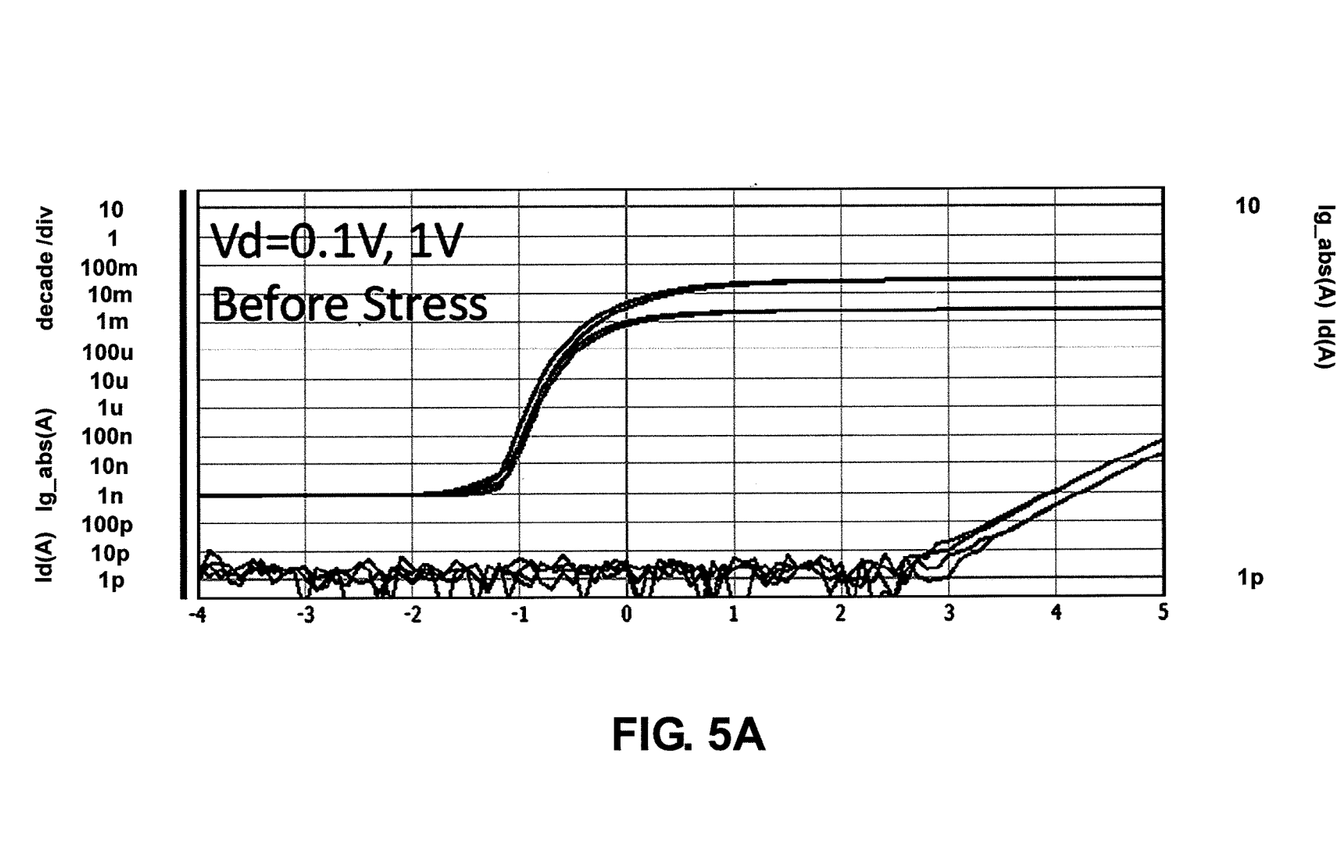
FIG. 5A shows a FET threshold voltage before stress.
Figure 5B:
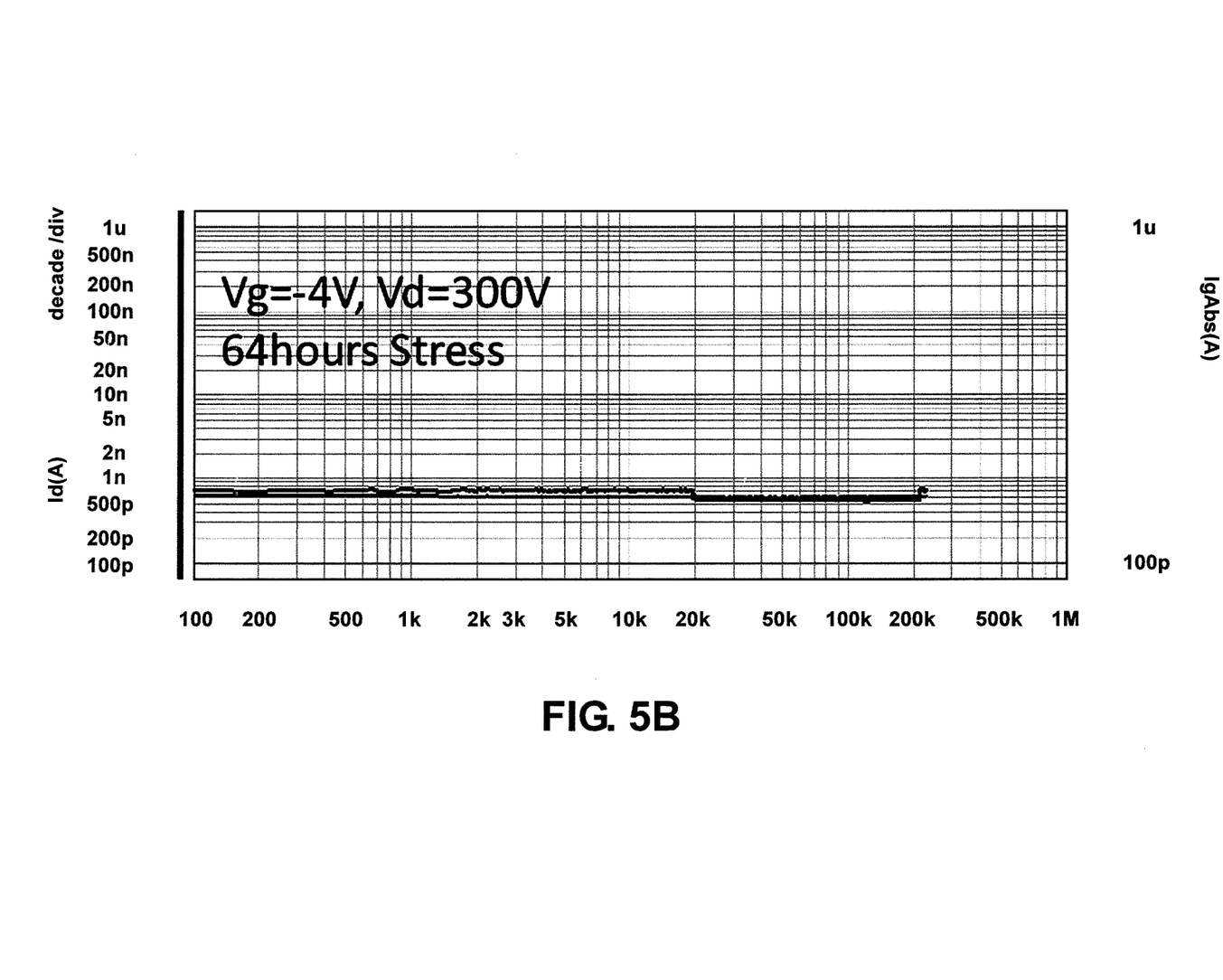
FIG. 5B shows a high 300 volt stress applied to the drain for 64 hours.
Figure 5C:
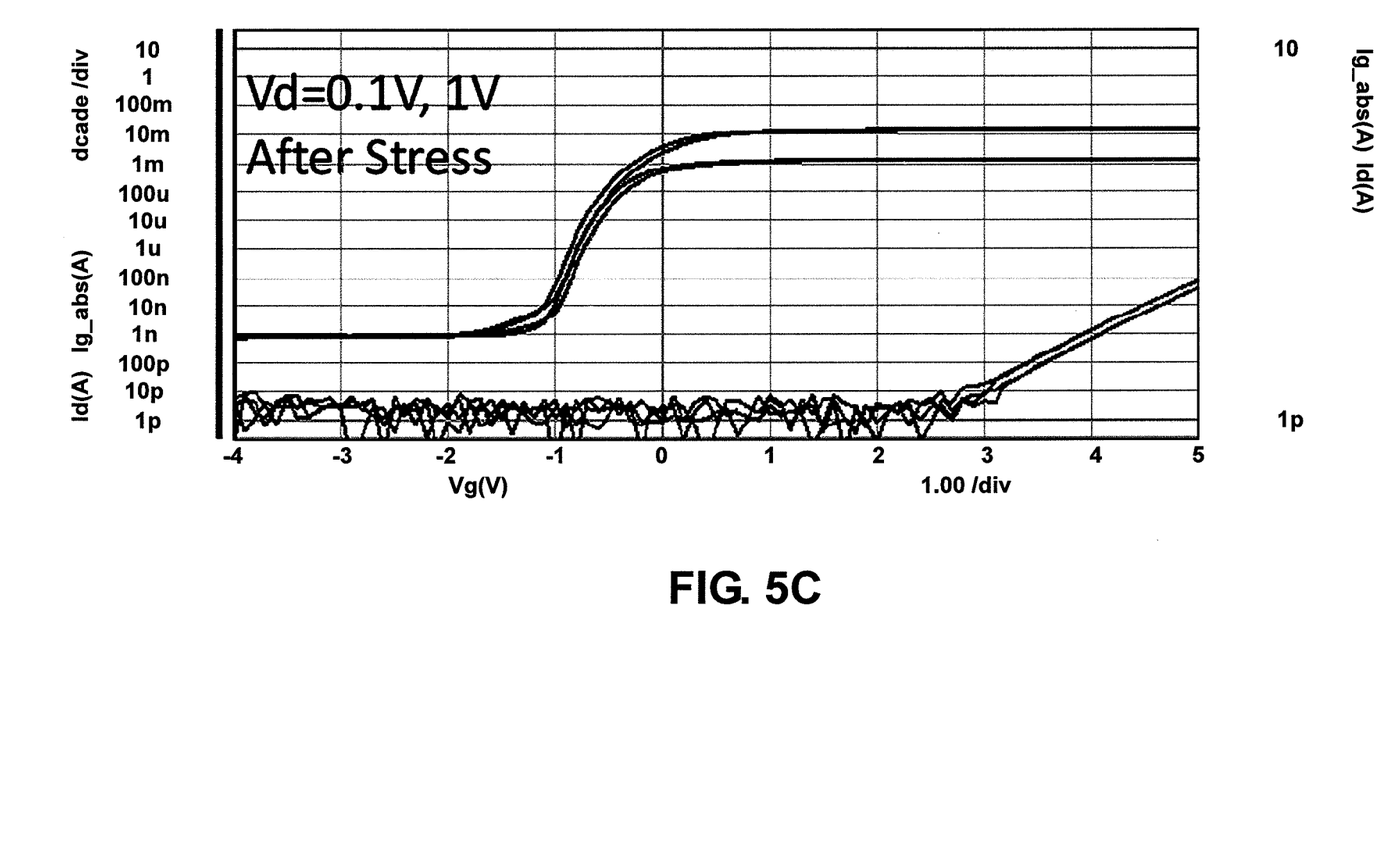
FIG. 5C shows the FET threshold voltage after the high voltage stress which shows no volt drift in the threshold voltage caused by the high voltage stress for a FET in accordance with the present disclosure.

FIGS. 5A, 5B and 5C show an example of threshold voltage drift for a FET with dual gates in accordance with the present disclosure. FIG. 5A shows the FET threshold voltage before stress, FIG. 5B shows a high 300 volt stress applied to the drain for 64 hours, and FIG. 5C shows that after the high voltage stress, the FET threshold voltage is the same as before the high voltage stress, which is the desired result.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of fabricating a field-effect transistor comprising:
   forming a III-nitride channel layer;
   forming a III-nitride barrier layer on top of the channel layer;
   forming a first dielectric on top of the barrier layer;
   forming a first gate trench through the first dielectric and partially or entirely through the barrier layer;
   forming a second dielectric on a bottom and walls of the first gate trench;
   forming a source electrode having electrical contact to the channel layer on a first side of the first gate trench;
   forming a drain electrode having electrical contact to the channel layer on a second side of the first gate trench opposite the first side;
   forming a first gate electrode on the second dielectric and filling the first gate trench;
   forming a third dielectric between the first gate trench and the drain electrode;
   forming a second gate trench extending through the third dielectric and laterally located between the first gate trench and the drain electrode; and
   forming a second gate electrode filling the second gate trench;

wherein the first gate electrode extends through the III-nitride barrier layer and into the III-nitride channel layer.

2. The method of claim 1 wherein a vertical distance between a bottom of the second gate electrode and a top surface of the barrier layer ranges from 1 nm to 100 nm.

3. The method of claim 1 wherein:
the second dielectric extends between the first gate trench and the drain electrode and is on the first dielectric;
the third dielectric is on the second dielectric; and
a bottom of the second gate electrode is between a top surface of the barrier layer and a top surface of the second dielectric.

4. The method of claim 1 wherein the second dielectric comprises at least one layer of AlN.

5. The method of claim 1 wherein the first dielectric comprises SiN.

6. The method of claim 1 wherein the third dielectric comprises SiN having a thickness ranging from 0.1 nm to 10 µm.

7. The method of claim 1 further comprising:
forming an electrical connection between the second gate electrode and the source electrode.

8. The method of claim 1 further comprising:
forming an electrical connection between the second gate electrode and the first gate electrode.

9. The method of claim 1 further comprising:
forming a III-nitride buffer layer on a substrate; and
forming the channel layer on the buffer layer;
wherein the substrate comprises Si, Sapphire, SiC, GaN or AlN.

10. The method of claim 1 wherein the III-nitride barrier layer comprises AlGaN having a thickness of 1 nanometer (nm) to 20 nm.

11. A method of fabricating a field-effect transistor comprising:
forming a Ill-nitride channel layer;
forming a Ill-nitride barrier layer on top of the channel layer;
forming a first dielectric on top of the barrier layer;
forming a first gate trench through the first dielectric and partially or entirely through the barrier layer;
forming a second dielectric on a bottom and walls of the first gate trench;
forming a source electrode having electrical contact to the channel layer on a first side of the first gate trench;
forming a drain electrode having electrical contact to the channel layer on a second side of the first gate trench opposite the first side;
forming a first gate electrode on the second dielectric and filling the first gate trench;
forming a third dielectric between the first gate trench and the drain electrode;
forming a second gate trench extending through the third dielectric and laterally located between the first gate trench and the drain electrode; and
forming a second gate electrode filling the second gate trench;
wherein the first gate is a normally-off gate while the second gate is a normally-on gate; and
wherein the first gate electrode extends through the III-nitride barrier layer and into the III-nitride channel layer.

12. The method of claim 11 wherein a vertical distance between a bottom of the second gate electrode and a top surface of the barrier layer ranges from 1 nm to 100 nm.

13. The method of claim 11 wherein:
the second dielectric extends between the first gate trench and the drain electrode and is on the first dielectric; the third dielectric is on the second dielectric; and a bottom of the second gate electrode is between a top surface of the barrier layer and a top surface of the second dielectric.

14. The method of claim 11 wherein the second dielectric comprises at least one layer of Al.

15. The method of claim 11 wherein the third dielectric comprises SiN having a thickness ranging from 0.1 nm to 10 µm.

16. The method of claim 11 further comprising:
forming an electrical connection between the second gate electrode and the source electrode; or
forming an electrical connection between the second gate electrode and the first gate electrode.

17. The method of claim 11 wherein the Ill-nitride barrier layer comprises AlGaN having a thickness of 1 nanometer (nm) to 20 nm.

* * * * *